(12) United States Patent
Ito et al.

(10) Patent No.: US 7,621,759 B2
(45) Date of Patent: Nov. 24, 2009

(54) ELECTRONIC APPARATUS AND METHOD OF MANUFACTURING ELECTRONIC APPARATUS

(75) Inventors: Dai Ito, Anjo (JP); Takayoshi Honda, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/320,545

(22) Filed: Jan. 29, 2009

(65) Prior Publication Data
US 2009/0191730 A1    Jul. 30, 2009

(30) Foreign Application Priority Data
Jan. 30, 2008   (JP)   ............... 2008-019577

(51) Int. Cl.
*H01R 12/00*   (2006.01)
(52) U.S. Cl. .......................................... 439/79; 439/83
(58) Field of Classification Search .............. 439/567, 439/573, 83, 79, 78
See application file for complete search history.

(56) References Cited

U.S. PATENT DOCUMENTS

| | | | |
|---|---|---|---|
| 7,400,511 B2 * | 7/2008 | Ito et al. ..................... | 361/760 |
| 2007/0193774 A1 | 8/2007 | Ito et al. | |
| 2008/0144260 A1 | 6/2008 | Honda | |
| 2008/0146051 A1 | 6/2008 | Honda | |

FOREIGN PATENT DOCUMENTS

| | | |
|---|---|---|
| JP | U-5-67049 | 9/1993 |
| JP | A-11-317265 | 11/1999 |
| JP | A-2001-358441 | 12/2001 |
| JP | A-2007-27242 | 2/2007 |

* cited by examiner

*Primary Examiner*—Javaid Nasri
(74) *Attorney, Agent, or Firm*—Posz Law Group, PLC

(57) ABSTRACT

An electronic apparatus is disclosed that includes a board and an electronic component having a body. The board has multiple through-holes and multiple lands covering multiple through-holes. The electronic component has multiple terminals. The terminals are respectively coupled with the lands while a part of each terminal being inserted into a through-hole. A shape of the through-hole is generally circular and different from a part of the land on a back surface of the board. The part of the land on the back surface has a width and the width is different in directions.

17 Claims, 10 Drawing Sheets

ELECTRONIC APPARATUS AND METHOD OF MANUFACTURING ELECTRONIC APPARATUS

CROSS REFERENCE TO RELATED APPLICATION

The present application is based on Japanese Patent Application No. 2008-19577 on Jan. 30, 2008, the disclosure of which is incorporated herein by reference.

BACKGROUND OF THE INVENTION

1. Field of the Invention

The present invention relates to an electronic apparatus in which an electronic component is mounted to a board by a reflow process. The present invention also relates to a method of manufacturing such an electronic apparatus.

2. Description of Related Art

There is known an electronic apparatus that has a board and an electronic component (e.g., connector) mounted to the board by a reflow process. JP-A-H11-317265 discloses an electronic apparatus where an insertion mounting part of a terminal is soldered to a land at a side-wall of a through-hole.

When a reflow process is used to connect an insertion mounting part of a terminal to a land at a side-wall of a through-hole, since a part of solder paste is placed inside the trough-hole, a reflow heat cannot directly applied to the part of solder paste inside the through-hole. In order to melt the solder paste inside the through-hole, the reflow heat needs to conduct to the solder paste through the terminal or another part of solder paste located on a surface of the board. However, the reflow-heat conduction can be interrupted by a surrounding terminal, an insulating base of the board, or a housing of the electronic component having the subject terminal. Therefore, it is difficult to conduct the enough heat to melt the solder paste inside the through-hole and it is difficult to ensure connection reliability.

SUMMARY OF THE INVENTION

In view of the above and other difficulties, it is an objective of the present invention to provide an electronic apparatus having improved connection reliability and a method of manufacturing such an electronic apparatus.

According to a first aspect of the present invention, an electronic apparatus is provided. The electronic component includes: a board having a front surface and a back surface opposite to each other; and an electronic component including a body made of an insulating material. The electronic component further includes multiple terminals. The multiple terminals is aligned on the body along a first direction. The first direction is substantially parallel to the front surface of the board. The terminals are partially held in the body. The board includes multiple lands. The electronic component is mounted to the board with the body being located on a front surface side of the board in such a manner that each terminal is coupled with a corresponding land through a solder. The board further has multiple through-holes. Each through-hole has a front open-end on the front surface of the board and a back open-end on the back surface of the board. The back open-end of the each through-hole has generally a circular shape. Each land includes a front land part, a back land part and a side-wall land part integrated together. The front land part of the each land surrounds the front open-end of a corresponding through-hole. The back land part of the each land surrounds the back open-end of the corresponding through-hole. The side-wall land part of the each land is located on a side-wall of the corresponding through-hole. The each terminal has an insertion-mounting part that is soldered to the corresponding land while being inserted into the corresponding through-hole. A shape of a perimeter of the back land part of the each land is different from the circular shape of the back open-end of the corresponding through-hole. The back land part of the each land has a first length and a second length different from each other. The first length is defined as a length of a first reference segment, wherein the first reference segment interconnects two points on the perimeter of the back land part, passes through a center of the corresponding through-hole, and is substantially parallel to the first direction. The second length is defined as a length of a second reference segment, wherein the second reference segment (i) interconnects other two points on the perimeter of the back land part, (ii) passes through a center of the corresponding through-hole and (iii) is substantially parallel to a second direction, the second direction being substantially perpendicular to the first direction and substantially parallel to the front surface of the board.

According to the above electronic apparatus, the perimeter shape of the back land part of the each land is different from the circular shape of the corresponding through-hole. Further, in, the back land part, the first length is different from the second length. For example, the width may be large in the first direction, along which the terminals are aligned. When an area of the back land part is made lager according to the above manner, it becomes possible to efficiently absorb reflow heat from the back surface side of the board in a reflow process where heat is applied from both the front surface side and the back surface side of the board. It becomes possible to conduct the absorbed heat to side walls of the through-holes. As a result, the melting of the solder inside the through-hole is promoted compared to a case of a conventional configuration, and it is thus possible to improve connection reliability between the lands and the terminals.

According to a second aspect of the present invention, a method for manufacturing an electronic apparatus is provided. The method includes: applying a solder in the form of paste to multiple lands formed in a board, wherein the board has multiple through-holes, wherein each land has a front land part, back land part and a side-wall land part integrated together, wherein the front land part of the each land surrounds an open end of a corresponding through-hole on a front surface side of the board, wherein the back land part of the each land surrounds another open end of through-hole on a back surface side of the board, wherein the side-wall land part of the each land is located on a side-wall of the corresponding through-hole. The method further includes: placing a first electronic component on the front surface side of the board, wherein the first electronic component has a body made of insulating material and multiple terminals partially held in the body; and performing a first reflow process to connect the each terminal and a corresponding land by applying heat while an part of the each terminal is being inserted into a corresponding through-hole. The board is prepared so that that the back land part of the each land has a first length and a second length different from each other. The first length is defined as a length of a first reference segment, wherein the first reference segment (i) interconnects two points on the perimeter of the back land part, (ii) passes through a center of the corresponding through-hole, and (iii) is substantially parallel to the first direction. The second length is defined as a length of a second reference segment, wherein the second reference segment (i) interconnects other two points on the perimeter of the back land part, (ii) passes through a center of the corresponding through-hole, and (iii) is substantially parallel to a second direction, the second direction being substantially perpendicular to the first direction and substantially parallel to the front surface of the board. In the first reflow process: the solder in the form of paste is applied to the multiple lands from the front surface side of the board; and the heat is applied from both the front and back surface sides of the board.

According to the above manufacturing method, an electronic component is mounted, by a reflow process, onto a board having a back land part where the first length is different from the second length, by applying heat to the board from the front surface side and the back surface side. Thus, in the reflow process, back land parts can efficiently absorb the heat applied from the back surface side, and the absorbed heat is efficiently conducted to side-wall land parts. Thereby, it is possible to accelerate the melting of solder located inside through-holes and improve connection reliability.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Example Embodiment

According to the exemplary embodiments, a connector is an example of an electronic component. An electronic control apparatus having a board and the connector mounted to the board is an example of an electronic apparatus having a board and an electronic component mounted to the board. It should be noted that, for simplicity, FIGS. 2 and 3 do not show a land and a solder, and FIG. 6 does not show a solder.

Figure 2:
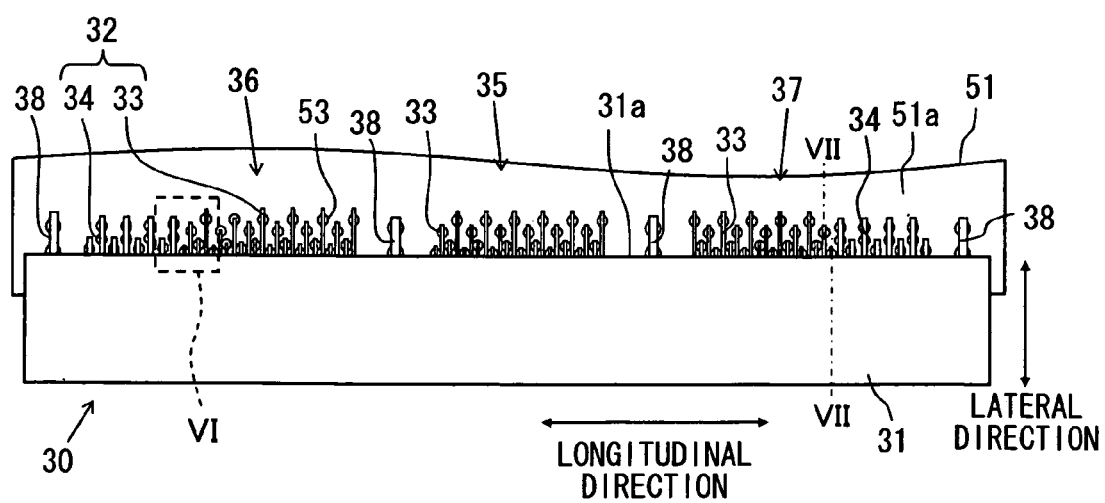
FIG. 2 is a plan view diagram illustrating a board and a connector mounted to the board, the diagram being viewed from a front surface side of the board.

In the exemplary embodiments, as shown in FIG. 2, an arranging direction of terminals on a housing is referred to as a longitudinal direction or a first direction. The longitudinal direction may be parallel to a front surface of the board. A direction perpendicular to the longitudinal direction and parallel to the front surface of the board is referred to as a lateral direction or a second direction, which may be parallel to a lateral direction of the housing. Further, a thickness direction of the board is referred to as a vertical direction. It should be noted that the above directions merely play a descriptive role and do not constrain an actual orientation of the electronic control apparatus.

Herein, an electronic control apparatus 1 (see FIG. 1) is an example of an electronic apparatus. The electronic control apparatus 1 can be used as an electronic control unit (ECU) for an engine of a vehicle and may not have a water proof structure. The electronic control apparatus 1 includes a connector 30 and a circuit board 50 to which the connector 30 is to be mounted. The electronic control apparatus 1 further includes a casing 10 for receiving the circuit board 50 that the connector 30 is mounted to.

Figure 1:
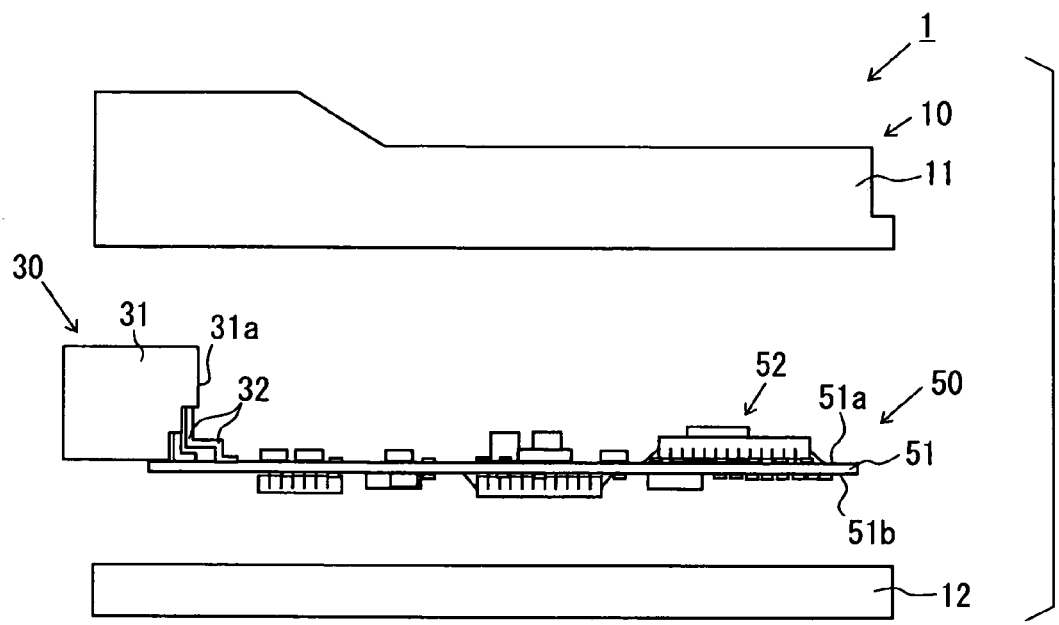
FIG. 1 is an exploded diagram illustrating an electronic control apparatus in accordance with an embodiment.

The casing 10 is made of resin or metal such as aluminum and iron, and receives the circuit board 50 and a part of the connector 30. As shown in FIG. 1, the casing 10 includes a case 11 and a cover 12. The case 11 has a boxed shape and has an opening on one side. The cover 12 has a generally rectangular plate shape and can close the opening of the case 11. Assembling the case 11 and the cover 12 provides the casing 10 having an internal space therein for receiving the circuit board 50 that the connector 30 is mounted to. The casing 10 or the case 11 defines a notch part (not shown) for a connector. The case 11 and the cover 12 can be assembled by, for example, screwing so as to receive the circuit board 50. In the above state, a part of the connector 30 and the circuit board 50 is accommodated in the casing 10 while the rest part of the connector 30 is exposed to an outside of the casing 10. The exposed part of the connector 30 includes parts of terminals 32 supposed to be connected to an external connector. Alternatively, the number of elements for the casing 10 is not limited. That is, the casing 10 may be formed using a single element or multiple elements.

Herein, the connector 30 is an example of an electronic component. The connector 30 is made of an electrical insulating material (e.g., resin). The connector 30 includes a housing 31 as a body, which is to be located on a front surface 51a side of a board 51. The connector 30 further includes multiple terminals 32 made of a conductive material. The terminals 32 are aligned along the front surface of the below-described board 51 while a part of each terminal 32 is being held in the housing 31. As the terminal 32, a terminal having the below-described first and second end parts can be employed. The first end part (i.e., a mounting part) projects from a front side 31a of the housing 31, and is to be soldered and electrically connected to a land, which land is integrally formed around an open-end and on a side-wall of a through-hole 53. The mounting part of each terminal is connected to the land by a reflow process in a state where the first end part is inserted into the through-hole 53. The second end part projects from a back side 31b of the housing 31, is exposed to an outside of the casing 10, and is to be electrically connected to an external connector. For example, a punch terminal or a bent terminal can be used as the above-described terminals 32. The punch terminal is, for example, one that is formed through punching a metal sheet into a piece having a predetermined preliminary-bent shape. The bent terminal is, for example, one that is formed through punching a metal sheet into a bar-shape piece and bending the bar-shaped piece.

Figure 4:
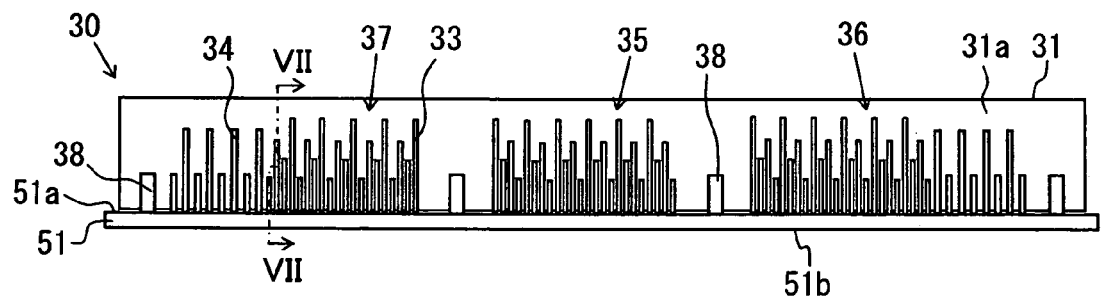
FIG. 4 is a plan view diagram illustrating a board and a connector mounted to the board, the diagram being viewed from a side where the connector is connected to the board.
Figure 5:
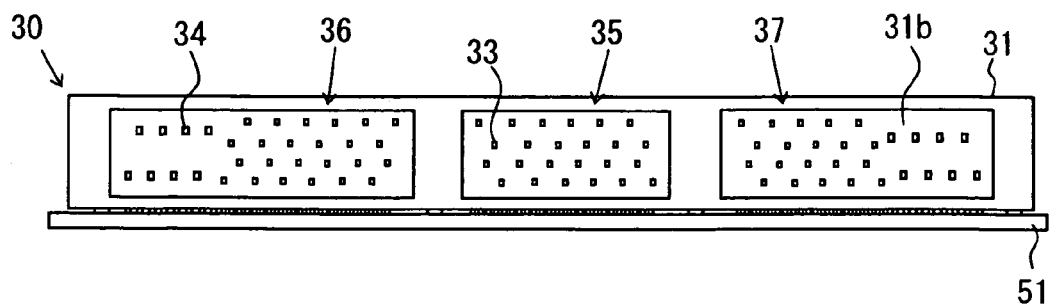
FIG. 5 is a plan view diagram illustrating a board and a connector mounted to the board, the diagram being viewed from a side where an external is to be connected.

The terminals 32 include terminals for electric connection, which are for example signal terminals 33 for signal transmission and power terminals 34 for electric power transmission. The power terminals 34 have a radial size larger than the signal terminals 32. All terminals 32 (33, 34) may be brass-plated punch terminals. As shown in FIGS. 2, 4 and 5, the terminals 32 are aligned along the longitudinal direction of the housing 31 having a planer rectangular shape while a part of each terminal 32 is being held in the housing 31 so that the terminals 32 do not interfere with each other. The use of the punch terminals as the terminals 32 can improve accuracy of positioning the terminal 32 relative to the land 60, compared to the use of the bent terminals.

Figure 7:
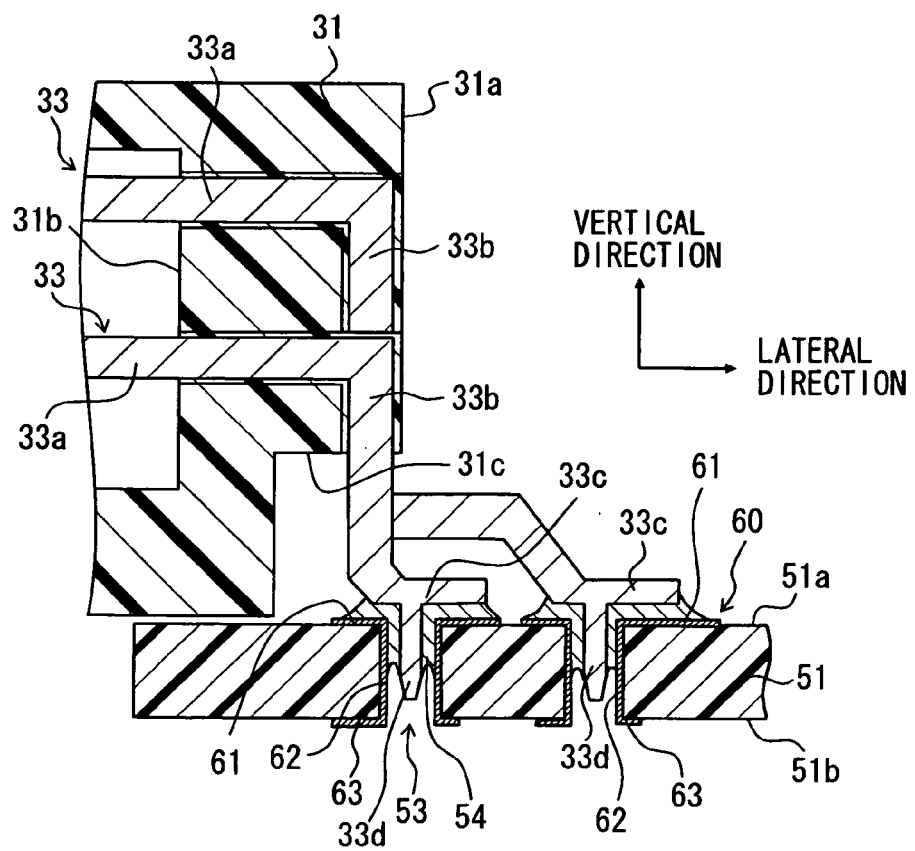
FIG. 7 is a cross sectional taken along line VII-VII in FIG. 2 or FIG. 4.

As exemplified by a signal terminal 33 in FIG. 7, each of all terminals 32 has a horizontal part 33a, a connection part 33b, and a mounting part. The mounting part includes a surface mounting part 33c and an insertion mounting part 33d. When the connector 30 is mounted onto the board 51, the horizontal part 33a becomes substantially parallel to the front surface 51a of the board 51 while extending along the lateral direction. Further, a part of the horizontal part 33a is exposed from a back side 31b of the housing 31 and is electrically connectable to an external connector. The connection part 33b connects one end of the horizontal part 33a and the mounting part. When the connector 30 is mounted onto the board 51, the surface mounting part 33c is located on the front land part 61 of the land 60 of the board 51 and becomes substantially parallel to the front surface 51a of the board 51 while extending along the lateral direction. Further, the surface mounting part 33c is be soldered to the front land part 61 of the land 60 by a reflow process. When the connector 30 is mounted onto the board 51, the insertion mounting part 33d is partially inserted into the thorough-hole 53 of the board 51 and soldered to a side-wall land part 62 of the land 60 by a reflow process. The side-wall land part 62 is located on the side-wall of the through-hole 53. The signal terminal 33 includes a generally T shaped structure with the surface mounting part 33c and the insertion mounting part 33d. Although not shown, each power terminal 34 has a horizontal part, a connection part, and a mounting part including a surface mounting part and an insertion mounting part, as the signal terminal 33 has.

Since the terminal 32 has the surface mounting part 33c and the insertion mounting part 33d, it is possible enlarge a contact area between the terminal 32 and the solder 54 and it is possible to further improve connection reliability.

As shown in FIGS. 2, 4, 5, the connector 30 has three terminal blocks 35, 36, 37, which are arranged in an alignment parallel to the longitudinal direction. One terminal block 35 has multiple signal terminals 33 only. Each of the other terminal blocks 36, 37 has multiple signal terminals 33 and multiple power terminals 34. Each terminal block can be connected with an external connector for connection to, for example, an engine-related line system. As shown on FIG. 5, the housing 31 separates the terminal blocks 35 to 37 from each other on an external connection side where the terminals are to be connected to the external connectors.

The reference numeral 38 in FIGS. 2 and 4 generally refers to a reinforcement terminal 38 for improving reliability of connection between the connector 30 and the board 51. The reinforcement terminal 38 has a horizontal part, a connection part, and a mounting part including a surface mounting part and an insertion mounting part, as the signal terminal 33 has. Since the reinforcement terminal 38 includes four terminals spaced away from each other and arranged in an alignment parallel to the longitudinal direction, the reinforcement terminal 38 can reinforce connection reliability. Alternatively, the reinforcement terminal 38 may not be provided. Even in such a case, it is possible to ensure connection reliability since each terminal 32 has the mounting part including the surface mounting part and the insertion mounting part.

As shown in FIG. 1, the circuit board 50 includes the board 51 and the electronic component 52 mounted to the board 51. The board 51 has a wiring, which has a land as an electrode, and a via hole for use in interconnecting the wiring. The electronic component 52 is, for example, a microcomputer, a power transistor, a resistor, a capacitor, or the like. The electronic components 52 are mounted and soldered to the front surface 51a and the back surface 51b of the board 51 by a reflow process. As one of the electronic components 52, the connector 30 for electrically connecting the circuit board 50 and an external element is mounted to the first surface 51a side of the board 51.

Figure 3:
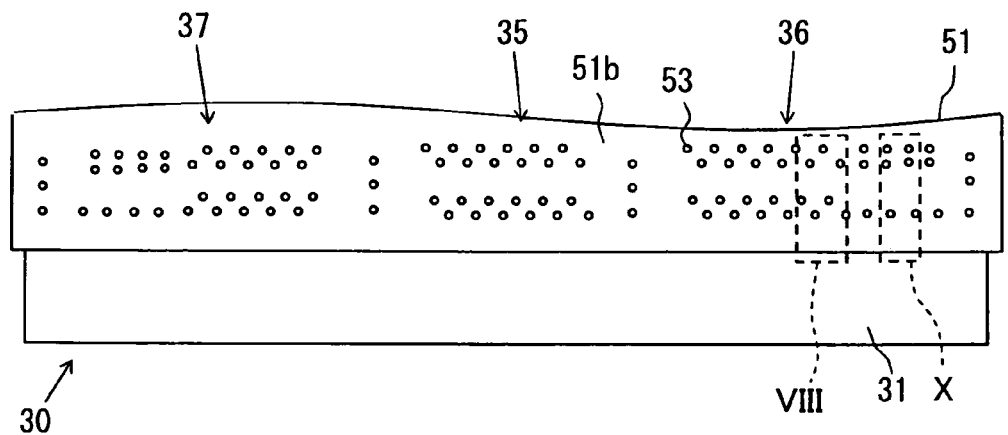
FIG. 3 is a plan view diagram illustrating a board and a connector mounted to the board, the diagram being viewed from a back surface side of the board.
Figure 6:
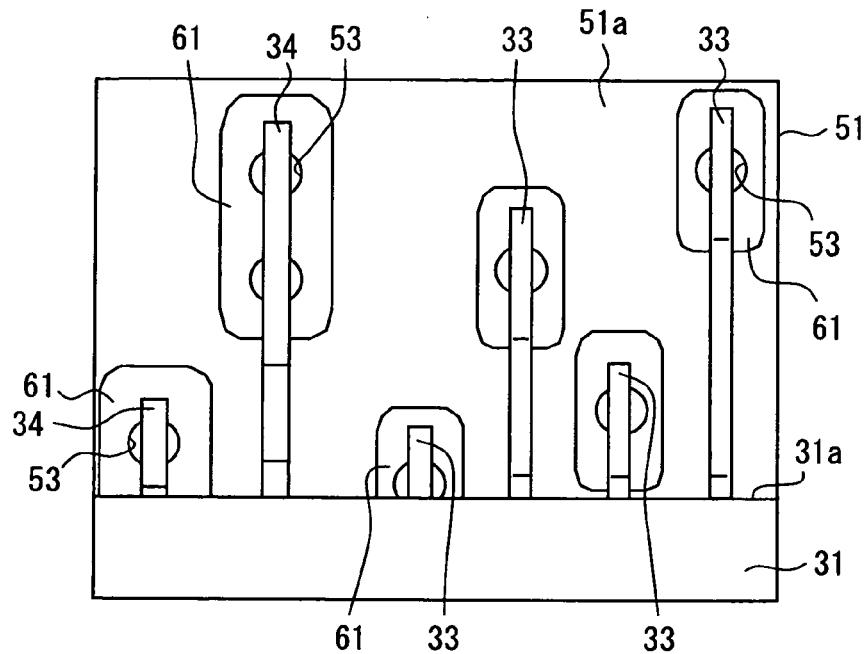
FIG. 6 is an enlarged plan view diagram illustrating a region surrounded by line VI in FIG. 2.
Figure 8:
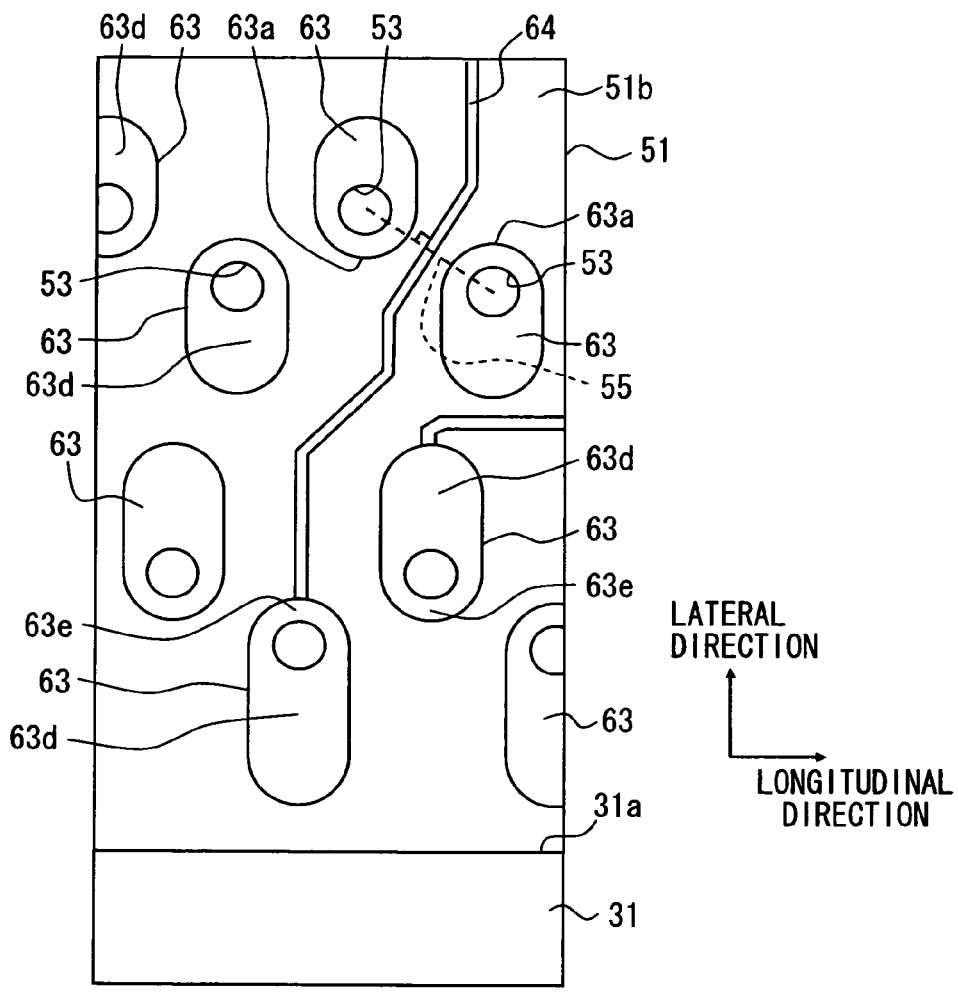
FIG. 8 is an enlarged plan view diagram illustrating a region surrounded by line VIII in FIG. 3.
Figure 9:
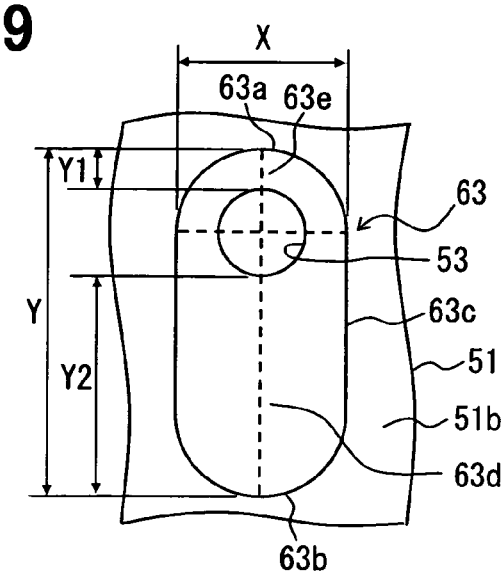
FIG. 9 is an enlarged plan view diagram illustrating a land on a back surface of a board.

As shown in FIGS. 2 and 3, for example, the board 51 has through-holes 53 for receiving the reinforcement terminal 38 and the terminals 32 of the connector 30. As shown in FIG. 7, each land 60 has integrated parts including a front land part 61, a side-wall land part 62 and a back land part 63. The front and back land parts 61, 63 are located around open-ends of the through-hole 53. The side-wall land part 62 is located on a side-wall of the through-hole. As shown in FIGS. 6, 8 and 9, the through-hole 53 has a generally circular shape (e.g., circle). As shown in FIGS. 2 and 3, multiple through-holes 53 are arranged along the longitudinal direction and arranged in rows spaced away from each other in the lateral direction.

As shown in FIGS. 3 and 8, through-holes 53 for the signal terminals 33 are arranged in four rows so that one row and another row is spaced mutually away in the lateral direction. Through-holes in each row are subsequently arranged in a line parallel to the longitudinal direction so that the through-holes of the each row are mutually spaced away in the longitudinal direction. More specifically, the four rows are a first row, a second row, a third row and a fourth row, which order correspond to an order of increasing distance from the housing 31. Through-holes in the first to fourth rows are arranged in a zigzag pattern. In terms of an order of distance from one end of the housing 31 (i.e., the one end corresponds to the right hand side of the FIG. 8) to a reference line (which line is parallel to the surface of the board 51 and perpendicular to the longitudinal direction to), some through-holes in the first to fourth rows has an order of the first row, the third row, the second row and the fourth row. In terms of an order of distance the other end of the housing 31 (i.e., the order end corresponds to the left hand side of FIG. 8) to the reference line, some through-holes in the first to fourth rows has an order of the first row, the forth row, the second row and the third row. As shown in FIGS. 3 and 8, the through-holes of the first and second rows are arranged in a zigzag pattern, and the through-holes of the third and fourth rows are also arranged in a zigzag pattern. As shown in FIGS. 6 and 8, one land 60 corresponds to one through-hole 53 (see the front land parts 61 in FIG. 6 and see the back land parts 63 in FIG. 8).

Figure 10:
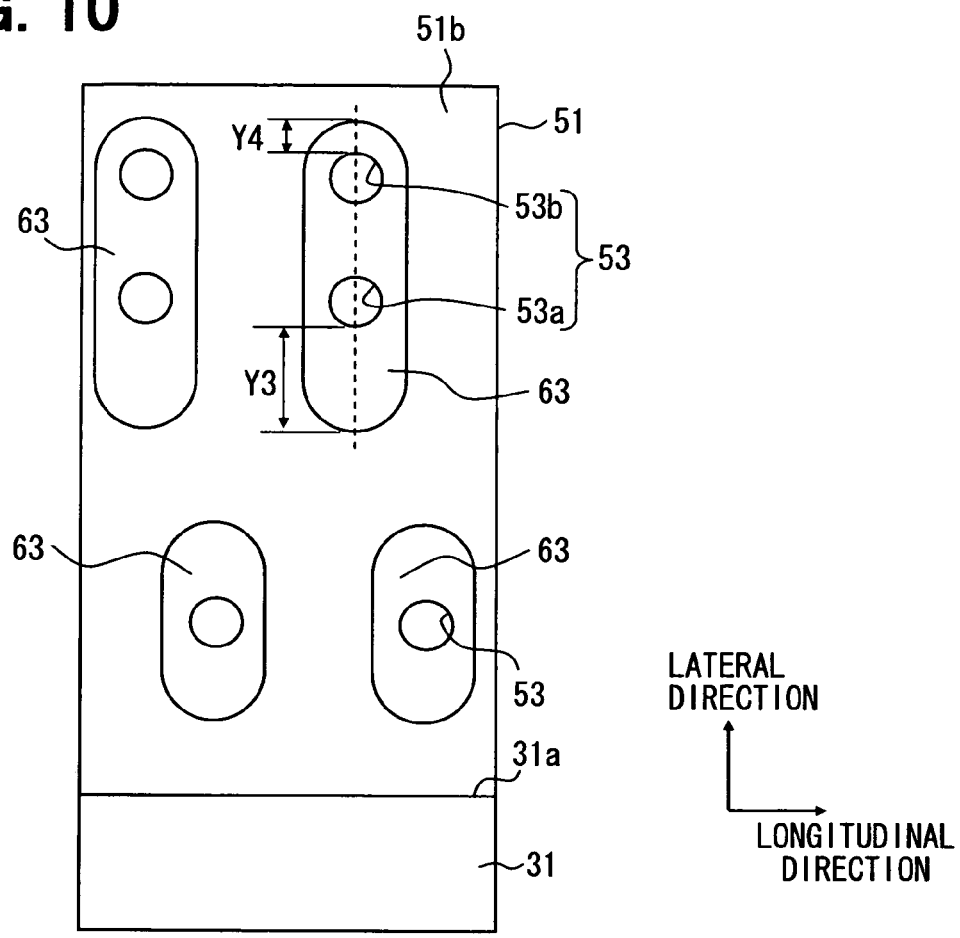
FIG. 10 is an enlarged plan view diagram illustrating a region surrounded by line X in FIG. 3.

As shown in FIG. 3 and FIG. 10, through-holes 53 for the power terminals 34 are arranged into three rows so that the rows are mutually spaced away in the lateral direction. The three rows for the power terminals 34 are first, second and third rows, which order corresponds to an order of increasing distance from the housing 31. The through-holes 53 in the second and the third rows are arranged in a rectangular grid pattern. One through-hole 53 in the second row and one through-hole 53 in the third row are arranged in an alignment parallel to the lateral direction. Each through-hole 53 in the first and each through-hole 53 in the second rows are arranged out of an alignment. In other words, the through-holes 53 in the first and second rows are arranged in a zigzag pattern. As shown in FIGS. 6 and 8, one through-hole 53 in the first row is surrounded by one land 60. In the second and third rows, one land 60 surrounds two through-holes 53, one of which in the first row and the other of which in the second row (see the front land parts 61 in FIG. 6 and see the back land parts 63 in FIG. 8).

As shown in FIG. 3, through-holes 53 for the reinforcement terminals 38 are arranged in three rows so that the rows are mutually spaced away in the lateral direction. Through-holes 53 in the three rows are arranged in an alignment parallel to the lateral direction. Although not shown, one land 60 surrounds three through-holes 53 that respectively belong to the three rows.

Each of the lands 60 is connected to a corresponding terminal 32 by using a solder 54 (see FIG. 7 for a case of the signal terminal 33). The lands 60 for the signal terminals 32 and the power terminals 33 can function as end portions (i.e., electrodes) of the wiring of the board 51. As shown in FIG. 7, each land 60 has a front land part 61 (i.e., a front land part), a back land part 63 (i.e., a back land part) and a side-wall land part 62 (i.e., a side-wall land part). The front land part 61 is located around an open-end of the through-hole 53 on the front surface 51a side of the board 51. The back land part 63 is located around an open-end of the through-hole 53 on the back surface 51b side of the board 51. The side-wall land part 62 is located on a side-wall of the through-hole 53. The above land 60 is formed through, for example, pattering a conductive film and plating.

As shown in FIGS. 6 and 7, a perimeter shape of the front land part 61 of the land 60 is different from the circular shape of the through-hole 53. Further, a land width of the front land part 61 around the open-end of the through-hole 53 is not constant. The front land part 61 has a generally rectangular shape such that the land with in the longitudinal direction is larger than that in the lateral direction. The shape of the front land part 61 is designed so as to correspond to the surface mounting part of the terminal 32 or the reinforcement terminal 38 (see a surface mounting part 33c in FIG. 7). As shown in FIG. 7, the surface mounting part of the terminal 32 or the reinforcement terminal 38 is placed on the front land part 61 of the corresponding land 60 in the longitudinal direction, and connected to the corresponding land 60 via the solder 54. The front land part 61 of the land 60 includes a patterned conductive film and a plated member located proximity to the open-end of the through-hole 53.

As shown in FIG. 7, the side-wall land part 62 of the land 60 is connected to the insertion mounting part (see the insertion mounting part 33d in FIG. 7) of the terminal 32 with the solder 54. Before a reflow process, the solder 54 in a paste form is applied from the front surface 51a side of the board 51. After a reflow process, as shown in FIG. 7, the solder 54 extends from the front surface 51a of the board 51 to an inside of the through-hole 53 and connects the land 60 and the insertion mounting part of the terminal 32. The side-wall land part 62 includes a plated member.

A perimeter shape of each back land part 63 is different from the circular shape of the through-hole. More specifically, as shown in FIG. 9, the perimeter of the back land part 63 has a pair of circular arcs (i.e., two half circles) and a pair of liner segments, each of which interconnects an end of one circular arc and an end of the other circuit arc. The pair of circular arcs are arranged in an alignment parallel to the lateral direction and opposed to each other such that a concave direction of each circular arc is directed away from a center of the back land part 63. The pair of linear segments are generally parallel to each other. Further, as shown in FIG. 9, the back land part 63 has a first length "X" between two points on the perimeter, which first length "X" is measured along a first reference line being parallel to the longitudinal direction and passing through the center of the through-hole 53. The back land part 63 has a second length "Y", which is measured along a second reference line being parallel to the lateral direction and passing through the center of the perimeter. The first length "X" is different from the second length "Y". The back land part 63 includes a patterned conductive film and a plated member. The plated member is located proximity to the open-end of the through-hole 53.

Figure 11:
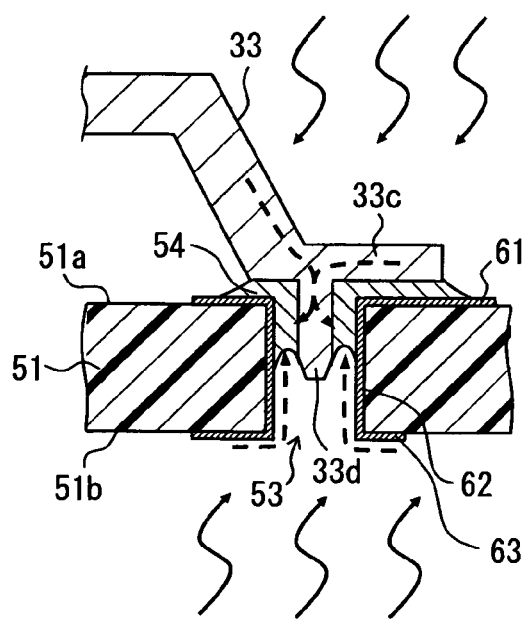
FIG. 11 is a cross sectional diagram for explaining an advantage due to a land on a back surface of a board.

As described above, the back land part 63 of each land 60 has the land width between the opening end of the through-hole 53 and the perimeter of the back land part 63. The land width varies according to directions. The land width in the longitudinal direction is longer or shorter than that in the lateral direction. The back land part 63 of each land 60 has a large area so as to efficiently absorb heat applied from the back surface 51b side in a reflow process. As shown in FIG. 11, when a reflow process is performed by heating both the front surface 51a side and the back surface 51b side of the board 51 to mount an electronic components 52 (e.g., connector 30) on the front surface 51a of the board 51, the back land parts 63 of the lands 60 efficiently absorb the heat applied from the back surface 51b side. The heat absorbed by the back land parts 63 are conducted to the solders 54 inside the through-holes 53 via the side-wall land parts of the lands 60. Accordingly, the melting of the solder 54 in the through-hole 53 is accelerated. It is possible to improve reliability of connection between the board 51 and the connector 30. Dashed-arrows in FIG. 11 illustrate representative heat conduction paths to the solder in the through-hole 53.

In the present embodiment, the length "X" of the back land part 63 is designed to be shorter than the length "Y". It is therefore possible to increase a size (e.g., area) of the back land part 63 and possible to efficiently absorb the heat applied from the back surface 51b side in the reflow process. Further, it is possible to minimize sizes of the board 51 and the connector 30 in the longitudinal direction along which the terminals 32 are arranged. Consequently, it is possible to minimize a size of the electronic control apparatus 1. According to the present embodiment, in particular, the number of terminals 32 arranged in the longitudinal direction is larger than that in the lateral direction. If the length "X" in the longitudinal direction were larger than the length "Y" in the lateral direction, the size of the board 51 in the longitudinal direction would become large. The present embodiment however makes it possible to minimize a dimension in the longitudinal direction.

As shown in FIG. 8, each back land part 63 for the signal terminal 71 surrounds one through-hole only, and a position of the through-hole 53 is displaced from the center of the corresponding back land part 63. In other words, as shown in FIG. 9, the back land part 63 has two different lateral land widths Y1, Y2, where the lateral land width is defined as a length between the open-end of the through-hole 53 and the perimeter of the back land part 63 in the lateral direction. Of the two different lengths, a shorter one is defined as Y1 and a longer one is defined as Y2 (i.e., Y2>Y1). Further, a portion of the back land part 63 having the shorter length Y1 is referred to as a portion 63e. Another portion having the longer length Y2 is referred to as a portion 63d. The through-holes 53 are arranged in a zigzag pattern. Regarding one of two back land parts 63 adjacent in the zigzag pattern, the portion 63d having the longer length Y2 is on a housing 31 side with respect to the corresponding through-hole 53. Regarding the other of the two back land parts 63, the portion 63e having the shorter length Y1 is on the housing 31 side with respect the corresponding through-hole 53. More specifically, the through-holes 53 for the signal terminals 71 in the first and second rows are arranged in a zigzag pattern. In the longitudinal direction, one back land parts 63 in the first row is adjacent to that in the second row. In the first row, the portion 63d having the longer length Y2 is on the housing side. In the second row, the portion 63e having the shorter length Y1 is on the housing side. In a similar way, the through-holes 53 in the third and fourth rows are arranged in a zigzag pattern. In the longitudinal direction, one back land parts 63 in the third row is adjacent to that in the fourth row. In the third row, the portion 63d having the longer length Y2 is on the housing side. In the fourth row, the portion 63e having the shorter length Y1 is on the housing side.

As shown in FIG. 8, in the back land part 63 for the signal terminal 33, the one 63a of the circular arc portions and the through-hole are concentric. The one 63a of circular arc parts is closer to the through-hole than the other of the circular arc parts. Further, the through-holes 53 are arranged in a zigzag pattern. Back land parts 63 adjacent to each other in the longitudinal direction (i.e., on the zigzag pattern) are intersected by a reference line 55 (see the dashed-line in FIG. 8) that interconnects the centers of the adjacent through-holes 53. A wiring line 64 extends from a back land part 63 that is located between the housing 31 and the adjacent back land parts 63. Further the wiring line 64 passes between the adjacent back land parts 63 so as to generally intersect a midpoint between the facing circular arc parts 63a of the adjacent back land parts 63. Further, the wiring line 64 intersects, at approximately 90 degrees, the reference line 55. More specifically, the through-holes 53 for the signal terminals 71 in the third and fourth rows are arranged in a zigzag pattern and satisfy the above relation. In an example shown in FIG. 8, the wiring line 64 extending from the back land part 63 in the first row passes between the back land parts 63 in the third and forth rows. In the above configuration, a distance between the adjacent back lands parts has minimum between the facing circular arc parts 63a intersected by the reference line 55. Accordingly, when the wiring line 64 is positioned so as to pass through the midpoint between the facing circular arc parts 63a and intersect the reference line 55 at an angle of approximately 90 degrees, it becomes possible to ensure a clearance between the wiring line and the back lands parts 63 while a dimension being reduced in the longitudinal direction. Further, it is possible to place the back land parts 63 having a large heat absorption capability, and thereby possible to increase connection reliability.

On the front surface side 51a of the board 51, as the lands 60 is closer to the housing 31, heat collection efficiently becomes lower. In other words, a row of lands 60 closer to the housing 31 can have lower heat collection efficiency. This is because a heat in a reflow process is interrupted by the housing 31 and the connection parts of the terminals 32 connected with a row of lands located distant from the housing 31 (cf. the connection part 33b shown in FIG. 7). In the present embodiment, however, the back land parts 63 corresponding to the four rows of signal terminals 33 has a length Y in the lateral direction between points of the perimeter such that the length Y becomes longer as the row of back lands parts is closer to the housing 31, as shown in FIG. 8. In other words, the first row of back land parts has a longest length Y and the fourth row of back land parts has a shortest length Y. As a result, the back land parts 63 of the lands compensate the low heat collection efficiency on the front surface 51a side. It is possible to improve reliability of connection between the signal terminals 33 and the rows of lands 60 located close to the housing 31.

As shown in FIG. 10, the back land parts 63 includes back land parts 63 for the power terminals 34. The back land parts 63 for the power terminals 34 are arranged in two rows. One of the two rows 63 closer to the housing 31 is a first row of back land parts 63 and the other of the two rows 63 distant from the housing 31 is a second row of back land parts 63. Each back land part 63 of the first row surrounds a single through-hole 53 of the first row of through-hole 53. Each back land part 63 of the second row surrounds two through-holes 53, one of which is in the second row of through-hole 53 and the other of which is in the third row of through-hole 53. Since each ear land part 63 of the second row surrounds multiple through-holes in an integrated manner, the back land part 63 has a large area. As a result, it is possible to improve connection reliability. In the above configuration, multiple (e.g., two) insertion mounting parts of a single power terminal 34 are respectively inserted into multiple through-holes 53a, 53b surrounded by a single back land part 63. Here, the two through-holes 53 surrounded by each back land part 63 are referred to as a close-to-body through-hole 53a and a distant-to-body through-hole 53b, wherein the close-to-body through-hole 53a is closer to the housing 32 in the lateral direction than the distant-to-body through-hole 53b. The back land part 63 in the second row has a distance Y3 in the lateral direction between the open-end of the close-to-body through-hole 53a and the facing perimeter of the back land part 63. The back land part 63 in the second row further has a distance Y4 in the lateral direction between the open-end of the distant-to-body through-hole 53b and the facing perimeter of the back land part 63. The length Y3 is designed longer than the length Y4. Accordingly, the back land parts 63 can compensate the low heat collection efficiency on the front surface 51a side, and it is possible to improve reliability of connection between the land 60 (i.e., side-wall land part 62) and the insertion mounting part of the terminal 34 inserted into the through-hole 53 located close to the housing 31. In the present embodiment, the first row of back land parts 63 and the second row of back land parts 63 are arranged into a zigzag pattern. Further, the through-hole 53 surrounded by the back land part 63 of the first row is located at a center of the corresponding back land part 63 in the lateral direction, which is different from a case of the through-holes 53 for the signal terminals 33.

A method for manufacturing an electronic control apparatus 1 is described below.

Figure 12A:
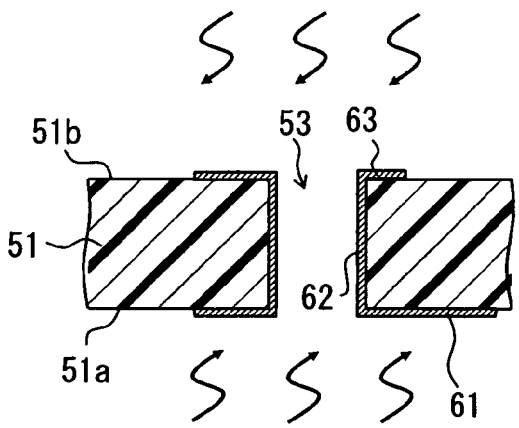
FIGS. 12A to 12C are cross sectional diagrams illustrating a reflow process.

The electronic control apparatus 1 are formed through mounting electronic components 52 onto the front surface 51a and the back surface 51b of the board 51 by reflow processes. The reflow processes includes a front side reflow process where an electronic component 52 including the connector 50 is mounted onto the front surface 51a of the board 51. The reflow processes further includes a back side reflow process where an electronic component 52 other than the connector 30 is mounted onto the back surface side 51b of the board 51. A method for manufacturing an electronic control apparatus 1 is described below more specifically. The board 51 and the electronic components 32 including the connector 30 are prepared. Then, as shown in FIG. 12A, the back side reflow process is performed. In the back side reflow process, the back surface 51b of the board 51 is directed upward. The solder 54 in a paste form are applied to lands formed on the back surface 51b by, for example, screen printing. The electronic components 52 is positioned and placed on the back surface 51b. In the above state, the electronic components 52 is reflow-mounted onto the back surface 51b of the board 51 by applying heat from both the front surface 51a side and the back surface 51b side of the board 51, as shown in FIG. 12A.

Figure 12B:
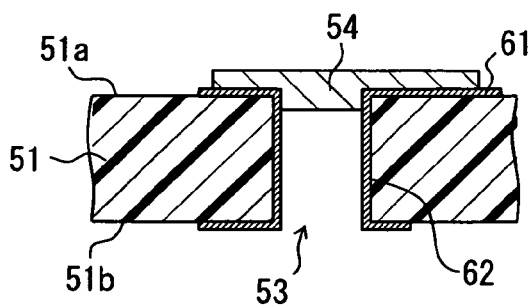

After finishing the back side reflow process, the front surface 51a of the board 51 is directed upward. By screen printing for instance, the solder in paste form is applied to the front lands parts 61 of the lands 60 formed on the front surface 51a, as shown in FIG. 12B. By the above applying, the solder 54 is placed not only on the front land parts 61 but inside the through-holes 53 surrounded by the front land parts 61, so that the solder 54 inside the through-hole 53 reaches a predetermined depth.

Figure 12C:
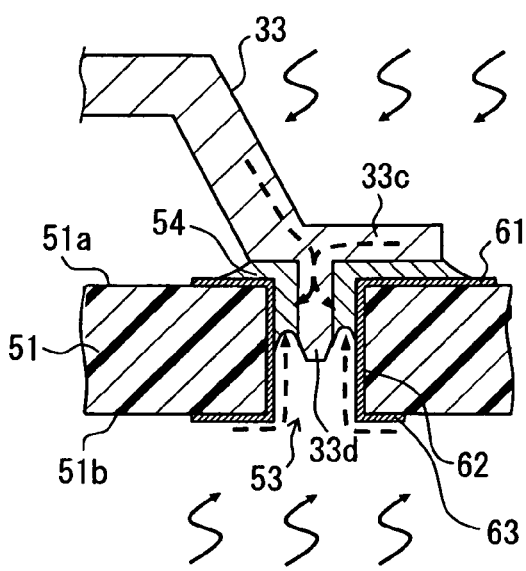

Then, as shown in FIG. 12C, the terminals 32 of the connector 30 (see the signal terminal 33 exemplified in FIG. 12C) are positioned and placed on the front surface 51a of the board 51, so that the insertion mounting parts of the terminals 32 (see the insertion mounting part signal terminals 33 exemplified in FIG. 12C) are inserted into the corresponding through-holes 53, and the surface mounting parts (see the surface mounting part 33c exemplified in FIG. 12C) are placed on the front land parts 61 of the lands 60. In a similar manner, the electronic components 52 other than the connector 30 is positioned and placed on the front surface 51a of the board 51. Then, heat is applied from the front surface 51a side and the back surface 51b side, and the electronic components 32 including the connector 30 are mounted onto the front surface 51a of the board.

According to the above manufacturing method, prepared is a board 51 having lands 60 for terminals 32 of the connector 30. Each of the lands 60 has a direction-dependent land width between the open-end of the through-hole 53 and the perimeter of the land. The land width is larger in one of the longitudinal and lateral directions. Then, the connector 30 is mounted onto the front surface 51a of the board 51 by a reflow process where the heat is applied from the front and back surface sides of the board 51. Thus, in the front side reflow processes, the back land parts 63 of the lands 60 absorb the heat applied from the back surface 51b side. Further, the absorbed heat is conducted through the side-wall land parts 62 of the lands 60 to the solder 54 inside the through-holes 53. Accordingly, the melting of the solder 54 in the through-holes 53 is promoted. As a result, it becomes possible to improve connection reliability.

When the electronic components 52 are mounted onto the front and back surfaces 51a, 51b of the board by the reflow process, if the front side reflow process is performed prior to the back side reflow process, the solder 54 may stick out to the back surface 51b side through the through-hole 53. The sticking out of the solder 54 to the back surface 51b side may lead to a problem; for example, when the solder 54 is applied to the back surface 51b of the board 51 in the back side reflow process, the sticking out solder 54 may contact a back surface of a screen (i.e., a mask) and may displace the application position of the solder 54. According to the present manufacturing method, however, the back side reflow process is performed before the front side reflow process. Therefore, it is possible to eliminate the problem of sticking out the solder 54 to the back surface 51b side.

According to the above manufacturing method, in the back side reflow process, the heat is applied from the front and back surface sides of the board 51. Alternatively, by applying heat from the back surface 51b side of the board 51 only, the electronic component 32 may be mounted onto the back surface 51b of the board 51 by a back side reflow process.

(Modifications)

The above-described example embodiment can be modified into various ways. Examples of modifications are described below.

In the example embodiment, the connector 30 is an example of an electronic component. The electronic control apparatus 1 having the board 51 and the connector 30 mounted to the board is an example of an electronic apparatus having a board and an electronic component mounted to the board. However, an electronic component is not limited to the above example. It is possible to employ an electronic component that has: a body made of an insulating material; multiple terminals aligned along a front surface of a board, wherein each terminal has an insertion mounting part and another part held in the body. For example, an electronic component may be a microcomputer.

In the above example, the electronic control apparatus 1 that does not have a waterproof structure is shown as an example of an electronic component. Alternatively, the electronic control apparatus 1 has a waterproof structure.

In the above example embodiment, an end part of each terminal, which end part is to be connected to the board, projects from the front side 31a of the housing 31 (i.e., electronic component) of the connector 30 (i.e., body). Alternatively, the end parts of terminals, which end parts are to be connected to the board, may project from multiple sides of the housing 31 (i.e., electronic component) of the connector 30 (i.e., body).

In the above example embodiment, the terminals 32 include the signal terminals 33 and the power terminals 34. However, types of the terminals 32 are not limited to the above examples. It is possible to employ a terminal having an insertion mounting part that is to be inserted into a through-hole 53 formed in the board 51, and that is to be soldered to a land 60 formed around an open-end of the through-hole 53 and on a side-wall of the through-hole 53. It is also possible to employ a terminal that does not have a surface mounting part but has an insertion mounting part. Alternatively, it is possible to employ a terminal having a surface mounting part that is not to contact with the solder 54.

Figure 13:
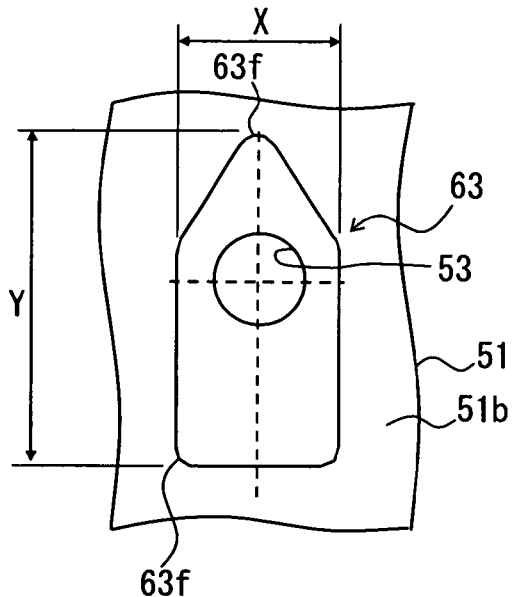
FIG. 13 is a diagram illustrating a back land part in accordance with a first modification example.

In the above example embodiment, the perimeter of the back land part 63 of each land 60 has: two opposing circular arc parts 63a, 63b (i.e., each generally half circle) whose convex directions are directed away from each other in the lateral direction; and linear connection parts 63c each interconnecting ends of the circular arc parts 63a, 63b. However, the perimeter shape of the back land part 63 is not limited to the above example. A shape of the perimeter of the back land part 63 of each land 60 different form the circular shape of the through-hole 53 may be sufficient. For example, as shown in FIG. 13, the perimeter shape of the back land shape 63 of the land may have a plane polygonal shape (e.g., a pentagonal shape in FIG. 13) with chamfered corners 63f. In such a polygonal shape, a length Y of the back land part 63 in the lateral direction can be longer than a length X in the longitudinal direction. Further, when a back land part has the chamfered corners 63f, it is possible to suppress jump of static electricity to a back land part 63 adjacent in the longitudinal or lateral direction. In this case, the static electricity may be one coming from outside. FIG. 13 is a plan view illustrating a modification example of a back land part and corresponding to FIG. 9. Herein, a shape with chamfered corners may be such a shape in which a corner portion 63f is rounded, or alternatively, two or more corners each having an angle of 90 degrees are connected.

Figure 14:
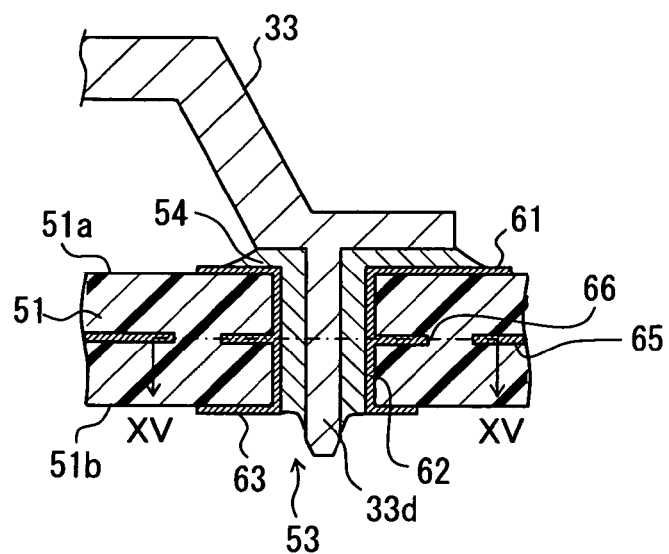
FIG. 14 is a cross sectional diagram illustrating a land in accordance with a second modification example.
Figure 15:
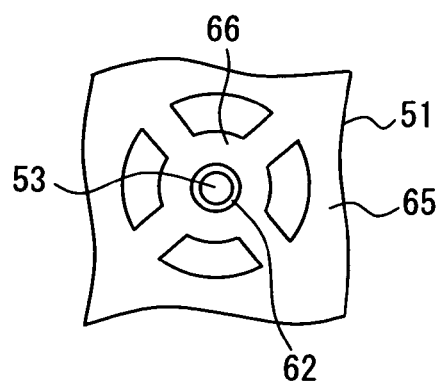
FIG. 15 is a cross sectional diagram taken along line XV-XV in FIG. 14.

The above example embodiment does not specify an inner layer part of the land 60, which inner layer part is located in an inner layer of a board 51 having a multilayer structure. However, in the board 51 in which the land 60 has the back land part 63 with a longer dimension in one of the longitudinal or lateral direction, as an inner layer land part connecting the side-wall land part 62 of the land 60 and a connective pattern 65 of the inner layer of the multilayer board in such a manner as shown in FIG. 14, such a thermal land part 66 exemplified in FIG. 15 may be employed. According to the above configuration, among the reflow heat received and collected on the back land parts 63 of the lands 60, it is possible to reduce a portion of the heat that conducts to the conductive pattern of the inner layer or an insulating base of the board 51 via the inner parts (i.e., thermal land part 66) of the lands 60, compared to a case of a plated inner layer. Thus, it is possible to efficiently conduct the heat collected on the back land parts 63 of the lands 60 to the solder inside the through-hole 53. As a result, it is possible to improve reliability of connection of the connector 30 to the board 51. FIG. 14 is a cross sectional diagram illustrating a modification example of a land and corresponding to FIG. 11. FIG. 15 is a cross sectional diagram taken along line XV-XV in FIG. 14.

Figure 16:
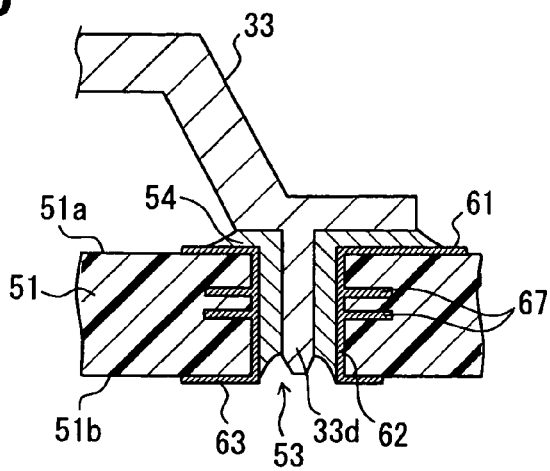
FIG. 16 is a cross sectional diagram illustrating a land in accordance with a third modification example.

As the inner layer part of the land 60, instead of the thermal land part 66, a dummy land part 67 exemplified in FIG. 16 may be employed. As shown in FIG. 16, the dummy land part 67 may be connected with the side-wall land part 62 of the land 60, spaced away from the conductive pattern 65 (not shown in FIG. 16) located in the same inner layer where the dummy land part is located, and formed in only one or more of the inner layers. According to the above configuration, the dummy land part 67 can function as a land for reinforcement and suppress crack generation that is caused by a difference in linear expansion coefficient between a conductive material of the land 60 and a material of an insulating base of the board 51. Such crack generation may take place in, for example, a cooling test. Since the dummy land part 67 may be located in one or more of the inner layers, it is possible to suppress conduction of a portion of heat to an insulating base of the board 51 through the dummy land part 67, compared to a case of placing the dummy land parts 67 in all inner layers. The dummy land part 67 may be located only in an inner layer having one of a GND pattern and a power supply pattern as the conductive pattern. Since the power supply pattern and the GND pattern are typically thicker than another conductive pattern (e.g., signal line), it is possible to suppress deformation (e.g., crack generation) caused by a difference in linear expansion coefficient. Further, since a layer with a power supply pattern or a GND pattern has a line margin larger than another layer, it is possible to restrict a decrease in degree of freedom of line of another conductive pattern 65 (e.g., signal line).

In the above example embodiment, the solder 54 is placed on the side-wall land part 62 of the land 60 so as to extend from the front surface 51a side to a predetermined depth toward the back surface 51b side. Alternatively, as shown in FIGS. 14 and 16, the solder 54 may be placed on whole side-wall land part 62 of the land. For example, the through-hole 53 may be filled with the solder 54. In an example shown in FIG. 14 or 16, although the solder 54 is not placed on the back land part 63 of the land 60, such a configuration restricts void generation in the thorough-hole 53 by the absence of the solder 54 on the back land part 63. Thus, it is possible to improve connection reliability. Further, in a front surface side reflow process, it is possible to prevent a solder 54 placed on the back land part 63 from dropping from the board 51. As shown in FIG. 14, the insertion mounting part 33d of the signal terminal 33 may pass through the through-hole 53 and project toward the back surface 51b side of the board 51. The insertion mounting part 33d of the signal terminal 33 may projects toward the back surface 51b side of the board 51.

Morphology of the lands 60 may not be limited to the above examples. For example, the lands 60 for the power terminals 34 may have the morphology that is applied to lands 60 for the signal terminals 33. Herein, the morphology includes: a perimeter shape; a relation of the length between two points of the perimeter in the lateral direction to that in the longitudinal direction; the number of through-holes 53 surrounded by a single land; a relation of length between the open end and the opposing perimeter.

In the above example embodiment, each of the lands 60 for the signal terminals surrounds a single through-hole 53 and the lands 60 are arranged in four rows so that each row extends perpendicular to the lateral direction. Further the through-holes 53 in the first and second rows are arranged in a zigzag pattern. Also, the through-holes 53 in the third and fourth rows are arranged in a zigzag pattern. Further, the lands 60 for the power terminals 34 are arranged in two rows so that each row extends perpendicular to the lateral direction. Each land 60 in the first row surrounds a single through-hole 53 and each land 60 in the second row surrounds two through-holes 53. However, arrangement of the lands 60 and the number of through-holes 53 that a single land 60 surrounds are limited to the above examples. For example, the lands 60 for the signal terminals 32 may be arranged in two rows so that each row extends perpendicular to the lateral direction. Further, each of the lands 60 for the power terminals 34 in the first and second rows may surround a single through-hole 53.

Figure 17:
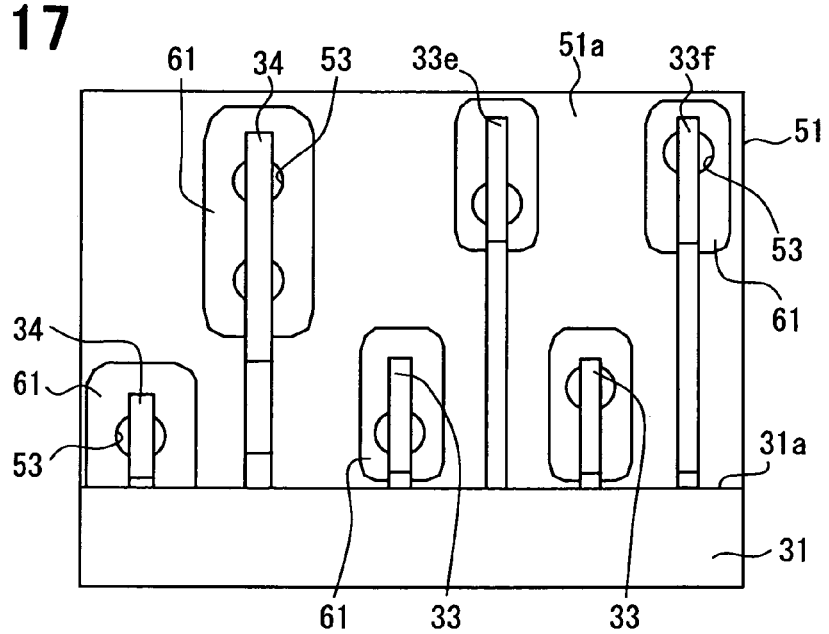
FIG. 17 is a plan view illustrating a front land part in accordance with a fourth modification example.
Figure 18A:
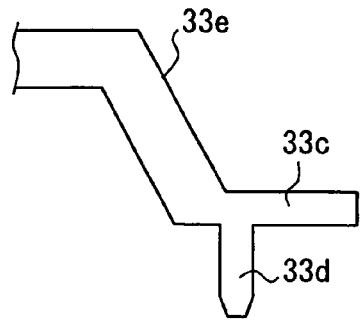
FIGS. 18A and 18B are schematic diagrams each illustrating a terminal.
Figure 18B:
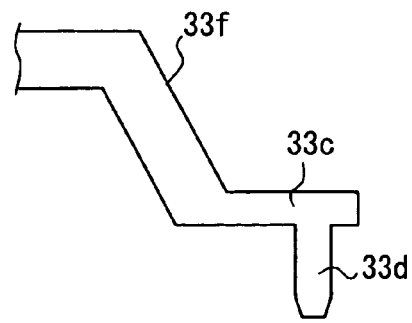

In the above example embodiment, the number of rows of back land parts 63 is equal to that of front land parts 61; for example, the back land parts 63 and the front land parts 61 of the lands 60 for the signal terminals 33 are arranged in four rows. Alternatively, the number of rows of back land parts 63 may be different from that of front land parts 61. For example, as shown in FIG. 17, the through-holes 53 for signal terminals 33 may be arranged in four rows so that each row extends perpendicular to the lateral direction. Further, the front land parts 61 of the lands 60 may be arranged in two rows so that each row extends perpendicular to the lateral direction. Although not shown in FIG. 17, the back land parts 63 of the lands 60 may be arranged in four rows so that each row extends perpendicular to the lateral direction as similar to those in the above example embodiment. In the above configuration, one front land part 61 in the first row and another front land part 61 in the second row may be arranged out of line parallel to the lateral direction. In an example shown in FIG. 17, a front land part 61 in the first row surrounds a through-hole 53 in the first row and a through-hole 53 in the second row. A front land part 61 in the second row surrounds a through-hole 53 in the third row and a through-hole 53 in the fourth row. In the above case, signal terminals 33*e*, 33*f* for the front land parts 61 in the second row, which are exemplified in FIG. 17, can have a common structure other than an insertion mounting part 33*d*, as shown in FIGS. 18A and 18B. FIG. 17 is a plan view illustrating a modification example of a front land part and corresponding to FIG. 6. FIGS. 18A and 18B are side views of terminals to be applied to lands shown in FIG. 17.

In the above example embodiment, when the solder 54 in paste form is applied, the solder 54 is placed on the front land parts 61 of the lands and inside through-holes 53. Alternatively, the solder 54 may be applied to the front land parts 61 of the land 60 only so that, in a reflow process, the molten solder 54 flows to insides of the through-hole 53 and the solder 54 may connect the side-wall land part 62 of the land 60 and the insertion mounting part of the terminal 32.

In the above example embodiment, the casing 10 includes (i) the box-shaped case 11 having an opening on one side and (ii) a cover 12 for closing the opening of the case and having a generally rectangular plate shape with a shallow bottom. However, a configuration of the casing 10 is not limited to the above example. For example, the casing 10 may be one including (I) a case that has a pouched structure having an opening on one side (e.g., on connector 30 side), and that cover the front surface 51*a* and the back surface 51*b* of the board 51; and (ii) a cover that clear a gap between the housing 31 of the connector 30 and the case in a state where the cover is attached to the case. Alternatively, the casing 10 may be one having the case with the pouched structure only when the case can also function as a cover.

In the above example embodiment, the housing 31 as a body is located on the front surface 51*a* of the board 51. Alternatively, the housing 31 may located on the front surface 51*a* of the board 51, and the terminals 32 or the reinforcement terminals 38 among member of the connector 30 may be located on the front surface 51*a* of the board 51.

Figure 19A:
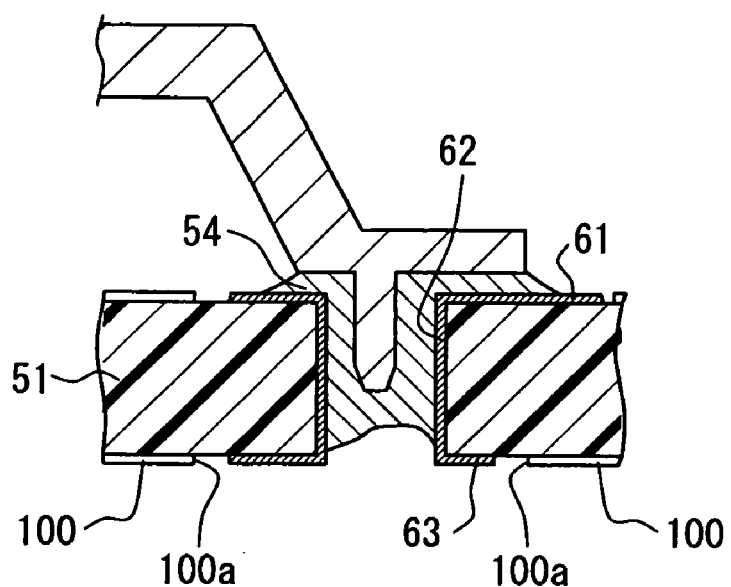
FIG. 19A is a cross sectional diagram illustrating a terminal, a through-hole, a solder, and a solder resist layer in accordance with a fifth modification example.
Figure 19B:
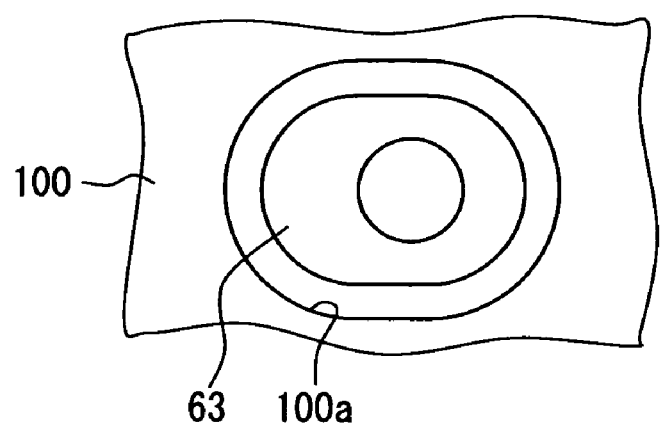
FIG. 19B is a plan view diagram illustrating a through-hole, a land and a solder resist layer in accordance with the fifth modification example.

The board 51 may have a solder resist layer 100 on the back surfaces 51*a*, 51*b* of the board 51, as shown in FIGS. 19A and 19B. The solder resist layer 100 on the back surfaces 51*b* has multiple openings 100*a* and is located at a surrounding of the back land part 63 of the land 60. The back land part 63 of the land 60 is located inside the opening 100*a* of the solder resist layer 100. The shape of the opening 100*a* of the solder resistor layer 100 is different from the circular shape of the open end of the through-hole 53. More specifically, the opening 100*a* of the solder resist layer 100 has a first length in the longitudinal direction and a second length in the lateral direction different form each other. The first length is defined as a length of a first reference segment, wherein the first reference segment (i) interconnects two points on the perimeter of the opening 100*a*, (ii) passes through a center of the corresponding through-hole 53, 53*a*, 53*b*, and (iii) is substantially parallel to the longitudinal direction. The second length is defined as a length of a second reference segment, wherein the second reference segment (i) interconnects other two points on the perimeter of the opening 100*a*, (ii) passes through the center of the through-hole 53, 53*a*, 53*b* and (iii) is substantially parallel to the lateral direction. In the above case, it may be preferable that the shape of the opening 100*a* may be similar to the shape of the back land part 64, so that a length of the opening 100*a* in one direction is longer than that in another direction. For example, in the opening 100*a*, the second length in the lateral direction may be longer than the first length, similarly to a case of the back land part. According to the above configuration, since the back land parts 63 are located in an outmost layer of the board 51, the lands 60 can directly receive the heat in a reflow process without interruption of the solder resist layer 100. Thus, it is possible to improve heat collection capability of the lands 60 and improve connection reliability. The solder resist layer 100 on the front surface 51*a* may be also configured to have a structure generally similar to that on the back surface 51*b* of the board 51.

Figure 20A:
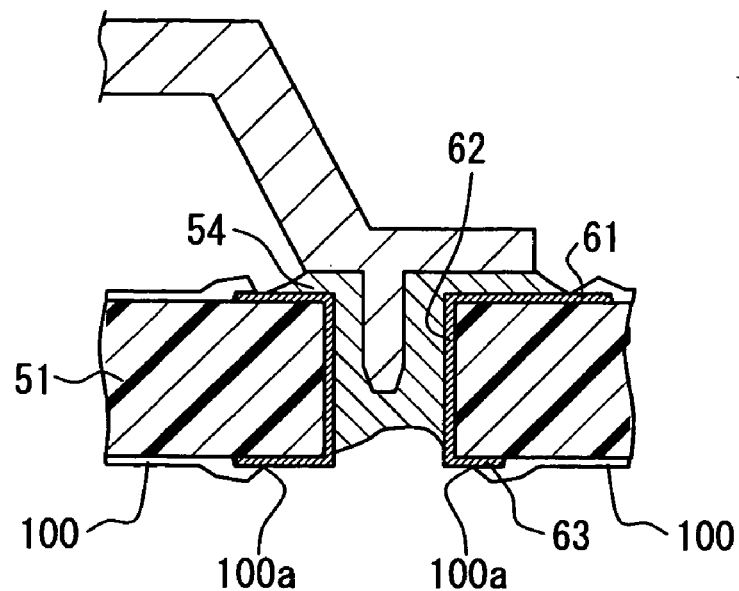
FIG. 20A is a cross sectional diagram illustrating a terminal, a through-hole, a solder, and a solder resist layer in accordance with a sixth modification example.
Figure 20B:
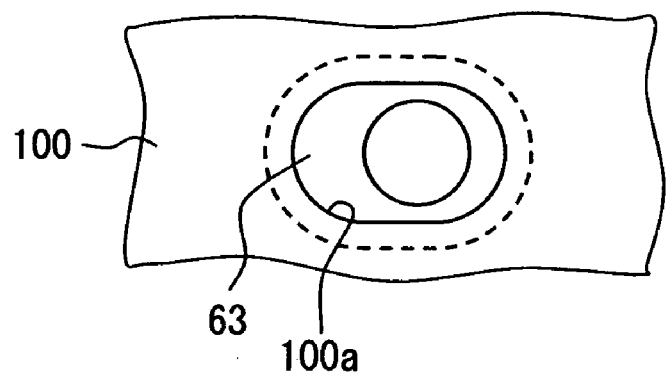
FIG. 20B is a plan view diagram illustrating a through-hole, a land and a solder resist layer in accordance with the sixth fifth modification example.

The above solder resist layer 100 may be modified in modified in various ways. For example, as shown in FIGS. 20A and 20B, the solder resist layer 100 on the back surface 51*b* covers a peripheral portion of the back land part 63 of each land 60 so that the back land part 63 is partially exposed through the opening 100*a*. In the above case, it may be also preferable that the shape of the opening 100*a* may be similar to the shape of the back land part 64. According to the above configuration, the lands 60 can directly receive the heat in a reflow process without interruption of the solder resist layer 100. It is possible to improve heat collection capability of the lands 60 and improve connection reliability.

The present disclosure includes the following aspects.

According to a first aspect, an electronic apparatus is provided. The electronic component includes: a board 51 having a front surface 51*a* and a back surface 51*b* opposite to each other; and an electronic component 30 including a body 31 made of an insulating material. The electronic component 30 further includes multiple terminals 32, 33, 33*e*, 33*f*, 34, 38, 71. The multiple terminals 32, 33, 33*e*, 33*f*, 34, 38, 71 is aligned on the body 31 along a first direction. The first direction is substantially parallel to the front surface 51*a* of the board 51. Terminals 32, 33, 33*e*, 33*f*, 34, 38, 71 are partially held in the body 31. The board 51 includes multiple lands 60. The electronic component 30 is mounted to the board 51 with the body 31 being located on a front surface 51*a* side of the board 51 in such a manner that each terminal 32, 33, 33*e*, 33*f*, 34, 38, 71 is coupled with a corresponding land 60 through a solder 54. The board 51 further has multiple through-holes 53, 53*a*, 53*b*. Each through-hole 53, 53*a*, 53*b* has a front open-end on the front surface 51*a* of the board 51 and a back open-end on the back surface 51*b* of the board 51. The back open-end of the each through-hole 53, 53*a*, 53*b* has generally a circular shape. Each land 60 includes a front land part 61, a back land part 63 and a side-wall land part 62 integrated together. The front land part 61 of the each land 60 surrounds the front open-end of a corresponding through-hole 53, 53*a*, 53*b*. The back land part 63 of the each land 60 surrounds the back open-end of the corresponding through-hole 53, 53*a*, 53*b*. The side-wall land part 62 of the each land 60 is located on a side-wall of the corresponding through-hole 53, 53*a*, 53*b*. The each terminal 32, 33, 33*e*, 33*f*, 34, 38, 71 has an insertion-mounting part 33*d* that is soldered to the corresponding land 60 while being inserted into the corresponding through-hole 53, 53*a*, 53*b*. A shape of a perimeter of the back land part 63 of the each land 60 is different from the circular shape of the back open-end of the corresponding through-hole 53, 53*a*, 53*b*. The back land part 63 of the each land 60 has a first length and a second length different from each other. The first length is defined as a length of a first reference segment, wherein the first reference segment (i) interconnects two points on the perimeter of the back land part 63, (ii) passes through a center of the corresponding through-hole 53, 53*a*, 53*b*, and (iii) is substantially parallel to the first direction. The second length is defined as a length of a second reference segment, wherein the second reference segment (i)

interconnects other two points on the perimeter of the back land part 63, (ii) passes through a center of the corresponding through-hole 53, 53a, 53b and (iii) is substantially parallel to a second direction, the second direction being substantially perpendicular to the first direction and substantially parallel to the front surface 51a of the board 51.

According to the above electronic apparatus, the perimeter shape of the back land part 63 of the each land 60 is different from the circular shape of the corresponding through-hole 53, 53a, 53b. Further, in, the back land part 63, the first length is different from the second length. That is, a width of the back land part 63, which is between the perimeter of the corresponding through-hole and the perimeter of the back land part 63, is not constant. For example, the width may be large in the first direction, along which the terminals are aligned. When an area of the back land part 63 is made lager according to the above manner, it becomes possible to efficiently absorb reflow heat from the back surface 51a side of the board 51 in performing reflow-mounting by applying the reflow heat from both the front surface 51a side and the back surface 51b side of the board 51. It becomes possible to conduct the absorbed heat to side walls of the through-holes 53. As a result, the melting of the solder 54 inside the through-hole 53 is promoted compared to a case of a conventional configuration, and it is thus possible to improve connection reliability between the lands 60 and the terminals 32, 33, 33e, 33f, 34, 38, 71.

In the above configuration, for example, the perimeter shape of the back land part 63 may be for instance ellipsoidal or polygonal when the back open end of the through-hole 53 has a generally perfect circle.

In the above electronic apparatus, the second length may be longer than the first length.

According to the above configuration, it becomes possible to downsize the board, the electronic component and the electronic apparatus in the first direction. In particular, the above configuration can become effective when the member of terminals is large.

The above electronic apparatus may be configured as follows. The multiple through-holes 53, 53a, 53b include a first group of through-holes 53, 53a, 53b and a second group of through-holes 53, 53a, 53b. The first group of through-holes 53, 53a, 53b is arranged in a first line, the first line being substantially parallel to the first direction. The second group of through-holes 53, 53a, 53b is arranged in a second line, the second line being substantially parallel to the first line. A distance between the first line and the body 31 is smaller than a distance between the second line and the body 31. The multiple lands 60 include a first group of lands 60 and a second group of lands 60. The first group of lands 60 respectively corresponds to the first group of through-holes 53, 53a, 53b. The second group of lands 60 respectively corresponds to the second group of through-holes 53, 53a, 53b. The second length of the back land part 63 in the first group of lands 60 is longer than that in the second group.

As a group of front land parts is located closer to a body, heat collection capability of the group becomes lower due to interruption of heat collection by the body or terminals coupled with another row of lands that is located distant from the body. According to the above configuration of the present disclosure, however, the above heat collection capability of the front land parts can be compensated due to the back land parts 63. It is thus possible to improve connection reliability.

The above electronic apparatus may configured as follows. The multiple through-holes 53, 53a, 53b include a first group of through-holes 53, 53a, 53b and a second group of through-holes 53, 53a, 53b. The first group of through-holes 53, 53a, 53b is arranged in a first line, the first line being substantially parallel to the first direction. The second group of through-holes 53, 53a, 53b is arranged in a second line, the second line being substantially parallel to the first line. The first group of through-holes 53, 53a, 53b and the second group of through-holes 53, 53a, 53b provide a zigzag pattern generally extending in the first direction. The multiple lands 60 includes a first group of lands 60 and a second group of lands 60. The first group of lands 60 respectively corresponds to the first group of through-holes 53, 53a, 53b. The second group of lands 60 respectively corresponds to the second group of through-holes 53, 53a, 53b. The first group of lands 60 includes a first land 60 and the second group of lands 60 includes a second land 60 adjacent to the first land 60 on the zigzag pattern. The perimeter of the back land part 63 of the first land 60 has a first perimeter portion. The first perimeter portion of the back land part 63 and the back open-end of the corresponding through-hole 53, 53a, 53b are generally concentric. The perimeter of the back land part 63 of the second land 60 has a second perimeter portion. The second perimeter portion of the back land part 63 and the back open-end of the corresponding through-hole 53, 53a, 53b are generally concentric. The board 51 has a wiring line 64 that passes through a midpoint of a third reference segment at an angle of 90 degrees. The third reference segment interconnects between the center of the through-hole 53, 53a, 53b corresponding to the first land 60 and the center of the through-hole 53, 53a, 53b corresponding to the second land 60 while intersecting the first perimeter portion and the second perimeter portion.

According to the above configuration, it is possible to dispose the lands 60 (e.g., the rear land parts 63 with high heat collection capability while clearance between the land 60 (e.g., back land part 63) and the wiring line 64 being ensured. It is possible to improve the connection reliability.

The above electronic apparatus may be configured such that the perimeter of the back land part 63 has a polygonal shape with a chamfered corner.

According to the above configuration, it is possible to suppress jump of static electricity from a land to an adjacent land. In this case, the static electricity may be one coming from outside.

The above electronic apparatus may be configured as follows. The multiple lands 60 include a multiple-part-connection land 60. The multiple through-holes 53, 53a, 53b include a first through-hole 53a and a second through-hole 53b. The multiple-part-connection land 60 surrounds a first through-hole 53a and a second through-hole 53b in an integral manner.

According to the above configuration, it is possible to enlarge an area of the back land part 63 and improve the connection reliability.

The above electronic apparatus may be configured as follows. The multiple terminals 32, 33, 33e, 33f, 34, 38, 71 include a multiple-part-connection terminal 34 having a first insertion-mounting part 33d and a second insertion-mounting part 33d. The first and second insertion-mounting parts 33d are respectively inserted into the first and second through-holes 53a, 53b surrounded by the multiple-part-connection land 60.

According to the above configuration, since the multiple-part-connection terminal 34 is designed to correspond to the multiple-part-connection land 60, it is possible to improve the connection reliability.

The above electronic apparatus may be configured as follows. The first through-hole 53a is located closer to the body 31 than the second through-hole 53b is. The perimeter of the back land part 63 of the multiple-part-connection land 60 has a close-to-body perimeter portion and a distant-from-body perimeter portion, which are arranged in a line substantially parallel to the second direction. The close-to-body perimeter portion is located closer to the body 31 than the distant-from-body perimeter portion is. A distance Y3 between the back open-end of the first through-hole 53a and the close-to-body perimeter portion is larger than a distance Y4 between the back open-end of the second through-hole 53b and the distant-to-body perimeter portion.

According to the above configuration, the heat collection capability of the front land parts can be compensated due to the back land parts. It is thus possible to improve connection reliability.

The above electronic apparatus may be configured as follows. The board 51 is a multilayer printed circuit board 51 having multiple layers. Each layer includes a conductive pattern having a wiring pattern. The multiple lands 60 includes a first land 60. The first land 60 has a thermal land part 66 located in a first layer of the multiple layers. The side-wall land part 62 of the first land 60 is coupled with the wiring pattern of the conductive pattern of the first layer through the thermal land part 66.

According to the above configuration, among the heat collected at the back land parts, it is possible to reduce conduction of a portion of heat to the conductive pattern or layers of the board. That is, the heat collected at the back land parts can be efficiently conducted to the solder inside the through-hole.

The above electronic apparatus may be configured as follows. The board 51 is a multilayer printed circuit board 51 having multiple layers. Each layer includes a conductive pattern having a wiring pattern. The multiple lands 60 include a first land 60 that has a dummy land part 67 located in a first layer of the multiple layers. The dummy land part 67 is connected with the side-wall land part 62 of the first land 60 and spaced away from the wiring pattern of the first layer.

According to the above configuration, since a dummy land (i.e., a land for reinforcement) is disposed in layers of a board to suppress generation of crack at a part of land inside a through-hole in a cooling test, and since the dummy land is located in one or more of the layers and is not located in some inner layer, it is possible to reduce transmission of a portion of the heat collected at the rear land parts to the board or the layers via the dummy land.

The above electronic apparatus may be configured such that the first layer has one of a power supply pattern and a ground pattern.

According to the above configuration, since the power supply pattern and the GND pattern are typically thicker than another conductive pattern (e.g., signal line), it is possible to suppress crack generation. Further, since a layer with the power supply pattern or the GND pattern typically has a line margin larger than another layer, it is possible to restrict a decrease in degree of freedom of line of another conductive pattern 65 (e.g., signal line).

The above electronic apparatus may be configured as follows. The multiple terminals 32, 33, 33e, 33f, 34, 38, 71 include a first terminal 32, 33, 33e, 33f, 34, 38, 71. The first terminal has a surface mounting part located on and soldered to the front land part 61 of the corresponding land 60.

According to the above configuration, since the terminal has the surface mounting part and the insertion mounting part, it is possible to further improve the connection reliability. It is alternatively possible to employ a terminal that has not a surface mounting part as a part of a mounting part.

The above electronic apparatus may be configures as follows. The electronic component 30 is a connector having a housing 31 that partially hold the multiple terminals 32, 33, 33e, 33f, 34, 38, 71. Some of the multiple terminals 32, 33, 33e, 33f, 34, 38, 71 has: a first end part connected with the corresponding land 60 of the board 51; and a second end part adapted to be connected with an external connector.

The above electronic apparatus may be configured as follows. The board 51 has a solder resist layer 100 on the back surface 51b. The solder resist layer 100 surrounds the back land part 63 of each land 60 so that the solder resist layer 100 has multiple openings 100a respectively corresponding to the multiple lands 60. A shape of each opening 100a is different from the shape of a corresponding through-hole 53. The each opening 100a of the solder resist layer 100 has a third length and a fourth length different form each other. The third length is defined as a length of a third reference segment, wherein the third reference segment (i) interconnects two points on the perimeter of the each opening 100a, (ii) passes through a center of the corresponding through-hole 53, 53a, 53b, and (iii) is substantially parallel to the first direction. The fourth length defined as a length of a fourth reference segment, wherein the fourth reference segment (i) interconnects other two points on the perimeter of the each opening 100a, (ii) passes through a center of the corresponding through-hole 53, 53a, 53b and (iii) is substantially parallel to the second direction.

Alternatively, the above solder resist layer 100 may be configured as follows. The solder resist layer 100 covers a peripheral portion of the back land part 63 of each land 60 so that the back land part 63 of the each land 60 is partially exposed through a corresponding opening 100a.

According to the above configuration, the back land parts 63 are located in an outmost layer of the board (51). The back land parts 63 can directly receive the heat in a reflow process without interruption of the solder resist layer 100. It is possible to improve heat collection capability of the back land parts 63.

According to a second aspect of the present disclosure, a method for manufacturing an electronic apparatus is provided. The method includes: applying a solder 54 in the form of paste to multiple lands 60 formed in a board 51, wherein the board 51 has multiple through-holes 53, 53a, 53b, wherein each land 60 has a front land part 61, back land part 63 and a side-wall land part 62 integrated together, wherein the front land part 61 of the each land 60 surrounds an open end of a corresponding through-hole 53, 53a, 53b on a front surface side of the board 51, wherein the back land part 63 of the each land 60 surrounds another open end of through-hole 53, 53a, 53b on a back surface side of the board 51, wherein the side-wall land part 62 of the each land 60 is located on a side-wall of the corresponding through-hole 53, 53a, 53b. The method further includes: placing a first electronic component 30 on the front surface 51a side of the board 51, wherein the first electronic component 30 has a body 31 made of insulating material and multiple terminals 32, 33, 33e, 33f, 34, 38, 71 partially held in the body 31. The method further includes: performing a first reflow process to connect the each terminal 32, 33, 33e, 33f, 34, 38, 71 and a corresponding land 60 by applying heat while an part of the each terminal 32, 33, 33e, 33f, 34, 38, 71 is being inserted into a corresponding through-hole 53, 53a, 53b. The board 51 is prepared so that that the back land part 63 of the each land 60 has: a first length and a second length. The first length is defined as a length of a first reference segment, wherein the first reference segment (i) interconnects two points on the perimeter of the back land part 63, (ii) passes through a center of the corresponding through-hole 53, 53a, 53b, and (iii) is substantially parallel to the first direction. The second length is defined as a second length defined as a length of a second reference segment, wherein the second reference segment (i) interconnects other two points on the perimeter of the back land part 63, (ii) passes through a center of the corresponding through-hole 53, 53a, 53b, and (iii) is substantially parallel to a second direction, the second direction being substantially perpendicular to the first direction and substantially parallel to the front surface 51a of the board 51, wherein the first length is different from the second length. In the first reflow process: the solder 54 in the form of paste is applied to the multiple lands 60 from the front surface 51a side of the board 51; and the heat is applied from both the front and back surface sides of the board 51.

According to the above manufacturing method, an electronic component is mounted, by a reflow process, onto a board having a back land part where the first length is different from the second length, by applying heat to the board from the front surface side and the back surface side. Thus, in the reflow process, back land parts can efficiently absorb the heat applied from the back surface side, and the absorbed heat is efficiently conducted to side-wall land parts. Thereby, it is possible to accelerate the melting of solder located inside through-holes and improve connection reliability.

The above method may further includes: performing a second reflow process to mount a second electronic component 52 to the back surface 51b of the board 51 before the performing of the first reflow process, wherein: in the first reflow process, a third electronic component 52 is mounted to the front surface 51a of the board 51.

Typically, when electronic components are mounted to front and back surfaces of a board by reflow processes, solder may stick out from a through-hole to a back surface side in a reflow process for mounting an electronic component to the front surface. In such a case, for example, the stick out solder may contact a back surface of a screen (i.e., a mask) for use in application of solder to the back surface of the board. According to the above method, however, it is possible to eliminate the above difficulty since the reflow process for mounting an electronic component to the back surface is performed prior to that to the front surface.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. An electronic apparatus comprising:
a board having a front surface and a back surface opposite to each other; and
an electronic component including a body made of an insulating material,
wherein:
the electronic component further includes a plurality of terminals;
the plurality of terminals is aligned on the body along a first direction, the first direction being substantially parallel to the front surface of the board;
each terminal is partially held in the body;
the board includes a plurality of lands;
the electronic component is mounted to the board with the body being located on the front surface of the board in such a manner that each terminal is coupled with a corresponding land through a solder;
the board further has a plurality of through-holes;
each through-hole has a front open-end on the front surface of the board and a back open-end on the back surface of the board;
the back open-end of the each through-hole has generally a circular shape;
each land includes a front land part, a back land part and a side-wall land part integrated together;
the front land part of the each land surrounds the front open-end of a corresponding through-hole;
the back land part of the each land surrounds the back open-end of the corresponding through-hole;
the side-wall land part of the each land is located on a side-wall of the corresponding through-hole;
the each terminal has an insertion-mounting part that is soldered to the corresponding land while being inserted into the corresponding through-hole;
a shape of a perimeter of the back land part of the each land is different from the circular shape of the back open-end of the corresponding through-hole;
the back land part of the each land has:
a first length defined as a length of a first reference segment, wherein the first reference segment (i) interconnects two points on the perimeter of the back land part, (ii) passes through a center of the corresponding through-hole, and (iii) is substantially parallel to the first direction; and
a second length defined as a length of a second reference segment, wherein the second reference segment (i) interconnects other two points on the perimeter of the back land part, (ii) passes through a center of the corresponding through-hole and (iii) is substantially parallel to a second direction, the second direction being substantially perpendicular to the first direction and substantially parallel to the front surface of the board; and
the first length is different from the second length.

2. The electronic apparatus according to claim 1, wherein:
the second length is longer than the first length.

3. The electronic apparatus according to claim 2, wherein:
the plurality of through-holes includes a first group of through-holes and a second group of through-holes;
the first group of through-holes are arranged in a first line, the first line being substantially parallel to the first direction;
the second group of through-holes are arranged in a second line, the second line being substantially parallel to the first line;
a distance between the first line and the body is smaller than a distance between the second line and the body;
the plurality of lands includes a first group of lands and a second group of lands;
the first group of lands respectively correspond to the first group of through-holes;
the second group of lands respectively correspond to the second group of through-holes; and
the second length of the back land part in the first group of lands is longer than that in the second group.

4. The electronic apparatus according to claim 2, wherein:
the plurality of through-holes includes a first group of through-holes and a second group of through-holes;
the first group of through-holes are arranged in a first line, the first line being substantially parallel to the first direction;
the second group of through-holes are arranged in a second line, the second line being substantially parallel to the first line;

the first group of through-holes and the second group of through-holes provide a zigzag pattern generally extending in the first direction;
the plurality of lands includes a first group of lands and a second group of lands;
the first group of lands respectively correspond to the first group of through-holes;
the second group of lands respectively correspond to the second group of through-holes;
the first group of lands includes a first land;
the second group of lands includes a second land adjacent to the first land on the zigzag pattern;
the perimeter of the back land part of the first land has a first perimeter portion;
the first perimeter portion of the back land part and the back open-end of the corresponding through-hole are concentric;
the perimeter of the back land part of the second land has a second perimeter portion;
the second perimeter portion of the back land part and the back open-end of the corresponding through-hole are concentric;
the board has a wiring line that passes through a midpoint of a third reference segment at an angle of 90 degrees; and
the third reference segment interconnects between the center of the through-hole corresponding to the first land and the center of the through-hole corresponding to the second land while intersecting the first perimeter portion and the second perimeter portion.

5. The electronic apparatus according to claim 2, wherein the perimeter of the back land part has a polygonal shape with a chamfered corner.

6. The electronic apparatus according to claim 2, wherein:
the plurality of lands includes a multiple-part-connection land;
the plurality of through-holes includes a first through-hole and a second through-hole; and
the multiple-part-connection land surrounds a first through-hole and a second through-hole in an integral manner.

7. The electronic apparatus according to claim 6, wherein:
the plurality of terminals includes a multiple-part-connection terminal having a first insertion-mounting part and a second insertion-mounting part; and
the first and second insertion-mounting parts are respectively inserted into the first and second through-holes surrounded by the multiple-part-connection land.

8. The electronic apparatus according to claim 7, wherein:
the first through-hole is located closer to the body than the second through-hole is;
the perimeter of the back land part of the multiple-part-connection land has a close-to-body perimeter portion and a distant-from-body perimeter portion, which are arranged in a line substantially parallel to the second direction;
the close-to-body perimeter portion is located closer to the body than the distant-from-body perimeter portion is; and
a distance between the back open-end of the first through-hole and the close-to-body perimeter portion is larger than a distance between the back open-end of the second through-hole and the distant-to-body perimeter portion.

9. The electronic apparatus according to claim 1, wherein:
the board is a multilayer printed circuit board having multiple layers;
each layer includes a conductive pattern having a wiring pattern;
the plurality of lands includes a first land that has a thermal land part located in a first layer of the multiple layers; and
the side-wall land part of the first land is coupled with the wiring pattern of the conductive pattern of the first layer through the thermal land part.

10. The electronic apparatus according to claim 1, wherein:
the board is a multilayer printed circuit board having multiple layers;
each layer includes a conductive pattern having a wiring pattern;
the plurality of lands includes a first land that has a dummy land part located in a first layer of the multiple layers; and
the dummy land part is connected with the side-wall land part of the first land and spaced away from the wiring pattern of the first layer.

11. The electronic apparatus according to claim 10, wherein:
the first layer has one of a power supply pattern and a ground pattern.

12. The electronic apparatus according to claim 1, wherein:
the plurality of terminals includes a first terminal; and
the first terminal has a surface mounting part located on and soldered to the front land part of the corresponding land.

13. The electronic apparatus according to claim 1, wherein:
the electronic component is a connector having a housing that partially hold the plurality of terminals; and
some of the plurality of terminals has:
a first end part connected with the corresponding land of the board; and
a second end part adapted to be connected with an external connector.

14. The electronic apparatus according to claim 1, wherein:
the board has a solder resist layer on the back surface;
the solder resist layer surrounds the back land part of each land so that the solder resist layer has a plurality of openings;
a shape of each opening is different from the circular shape of the back open end of the corresponding through-hole;
the each opening of the solder resist layer has:
a third length defined as a length of a third reference segment, wherein the third reference segment (i) interconnects two points on the perimeter of the each opening, (ii) passes through a center of the corresponding through-hole, and (iii) is substantially parallel to the first direction; and
a fourth length defined as a length of a fourth reference segment, wherein the fourth reference segment (i) interconnects other two points on the perimeter of the each opening, (ii) passes through a center of the corresponding through-hole and (iii) is substantially parallel to the second direction; and
the third length is different from the fourth length.

15. The electronic apparatus according to claim 14, wherein
the solder resist layer covers a peripheral portion of the back land part so that the back land part is partially exposed through a corresponding opening of the solder resist layer.

16. A method for manufacturing an electronic apparatus, comprising:
applying a solder in the form of paste to a plurality of lands formed in a board, wherein the board has a plurality of through-holes, wherein each land has a front land part, back land part and a side-wall land part integrated together, wherein the front land part of the each land surrounds an open end of a corresponding through-hole on a front surface side of the board, wherein the back land part of the each land surrounds another open end of through-hole on a back surface side of the board, wherein the side-wall land part of the each land is located on a side-wall of the corresponding through-hole;

placing a first electronic component on the front surface side of the board, wherein the first electronic component has a body made of insulating material and a plurality of terminals partially held in the body; and performing a first reflow process to connect the each terminal and a corresponding land by applying heat while an part of the each terminal is being inserted into a corresponding through-hole, wherein:

the board is prepared so that that the back land part of the each land has:
- a first length defined as a length of a first reference segment, wherein the first reference segment (i) interconnects two points on the perimeter of the back land part, (ii) passes through a center of the corresponding through-hole, and (iii) is substantially parallel to the first direction; and
- a second length defined as a length of a second reference segment, wherein the second reference segment (i) interconnects other two points on the perimeter of the back land part, (ii) passes through a center of the corresponding through-hole, and (iii) is substantially parallel to a second direction, the second direction being substantially perpendicular to the first direction and substantially parallel to the front surface of the board, wherein the first length is different from the second length; and in the first reflow process:
- the solder in the form of paste is applied to the plurality of lands from the front surface side of the board; and
- the heat is applied from both the front and back surface sides of the board.

17. The method according to claim 16, further comprising:

performing a second reflow process to mount a second electronic component to the back surface of the board before the performing of the first reflow process, wherein:

in the first reflow process, a third electronic component is mounted to the front surface of the board.

* * * * *